(12) United States Patent
Sasaki et al.

(10) Patent No.: US 7,224,432 B2
(45) Date of Patent: May 29, 2007

(54) STAGE DEVICE, EXPOSURE APPARATUS, AND DEVICE MANUFACTURING METHOD

(75) Inventors: Yasuhito Sasaki, Utsunomiya (JP);
 Yoshikazu Miyajima, Utsunomiya (JP);
 Hitoshi Sato, Utsunomiya (JP);
 Katsumi Asada, Utsunomiya (JP);
 Hideo Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 69 days.

(21) Appl. No.: 11/127,292

(22) Filed: May 12, 2005

(65) Prior Publication Data

US 2005/0254036 A1 Nov. 17, 2005

(30) Foreign Application Priority Data

May 14, 2004 (JP) .............................. 2004-144896

(51) Int. Cl.
 *G03B 27/42* (2006.01)
 *G03B 27/58* (2006.01)
 *H02K 41/00* (2006.01)
(52) U.S. Cl. .............................. 355/53; 355/72; 310/12
(58) Field of Classification Search ................. 355/53, 355/72; 310/12; 318/135; 269/73
 See application file for complete search history.

(56) References Cited

U.S. PATENT DOCUMENTS 5,815,246 A * 9/1998 Sperling et al. .............. 355/53

| 6,028,376 | A | 2/2000 | Osanai et al. ................. 310/12 |
| 6,144,119 | A * | 11/2000 | Hazelton ...................... 310/12 |
| 6,414,742 | B1 | 7/2002 | Korenaga et al. ............. 355/53 |
| 6,449,030 | B1 * | 9/2002 | Kwan ........................... 355/72 |
| 6,452,292 | B1 * | 9/2002 | Binnard ........................ 310/12 |
| 2002/0021423 | A1 | 2/2002 | Korenaga et al. ............. 355/53 |
| 2002/0054280 | A1 * | 5/2002 | Tokuda et al. ................. 355/53 |
| 2004/0126907 | A1 | 7/2004 | Korenaga ..................... 438/10 |

FOREIGN PATENT DOCUMENTS

| JP | 11-190786 | 7/1999 |
| JP | 11-243132 | 9/1999 |
| JP | 2002-23764 | 1/2002 |
| JP | 2004-254489 | 9/2004 |

\* cited by examiner

*Primary Examiner*—Alan Mathews
(74) *Attorney, Agent, or Firm*—Fitzpatrick, Cella, Harper & Scinto

(57) ABSTRACT

A stage device including a movable stage, a plate-like base which supports the stage, and a mass body which moves to cancel a reaction force acting on the base according to a movement of the movable stage. The plate-like base has a plurality of surfaces, and the stage and mass body are supported by different ones of the surfaces of the plate-like base.

15 Claims, 16 Drawing Sheets

F I G. 8
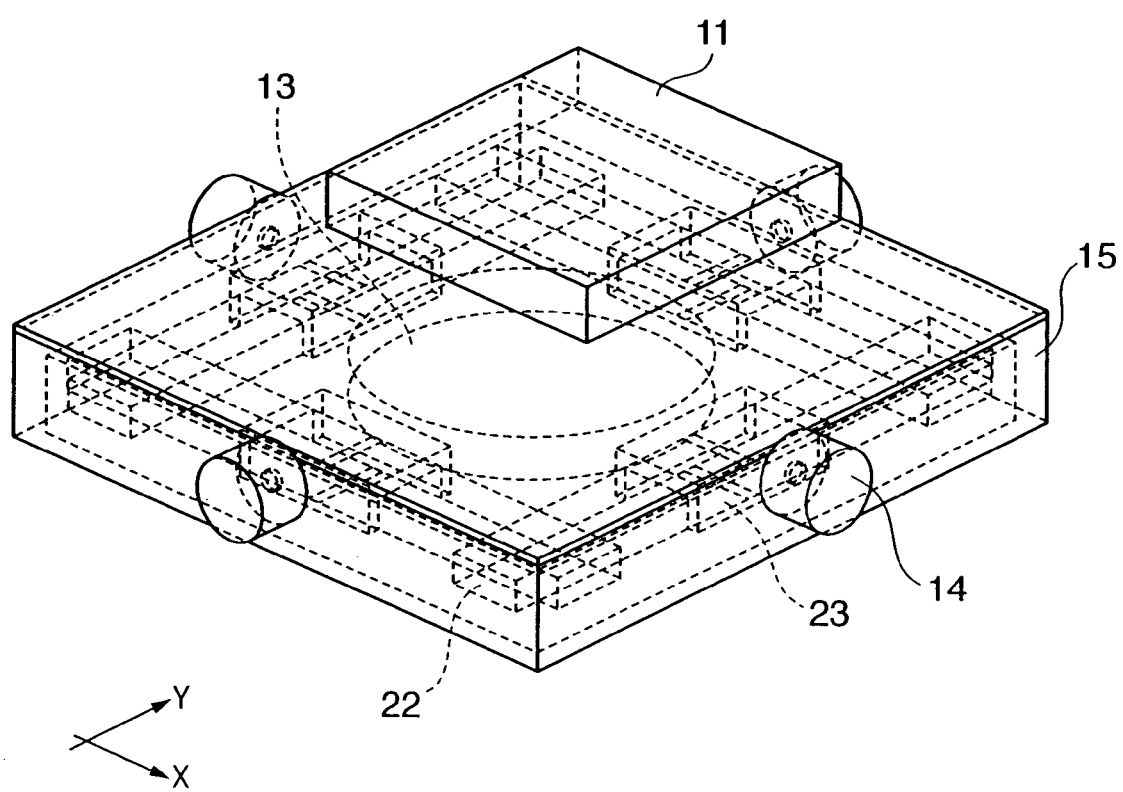

STAGE DEVICE, EXPOSURE APPARATUS, AND DEVICE MANUFACTURING METHOD

FIELD OF THE INVENTION

The present invention relates to a stage device which performs alignment and, more particularly, to a stage device which is suitably used in a semiconductor exposure apparatus or a liquid crystal exposure apparatus.

BACKGROUND OF THE INVENTION

In a stage device which performs alignment, a drive reaction force generated when a stage is driven causes vibration or deformation to influence the alignment accuracy. This influence poses a problem, particularly in a field, e.g., a stage device used in an exposure apparatus, which requires high accuracy.

As a mechanism which cancels the drive reaction force of a stage, in Japanese Patent Laid-Open No. 111-243132, mass bodies are provided to a base, which supports the stage. Referring to FIG. 15, mass bodies (113a, 113b), which can be driven in an X direction, and mass bodies (113c, 113d), which can be driven in a Y direction, are provided to a base (109) which supports a stage (105) which moves in X and Y directions along guides (121, 107). A rotary mass body (not shown), which generates a rotational torque, is provided to the base. With this structure, the mass bodies are driven to cancel stage drive reaction forces in the X and Y directions and a θ direction (rotational direction about a Z-axis), so as to decrease the influence of the vibration caused by the drive reaction force.

In Japanese Patent Laid-Open No. 11-190786, a base that supports a stage is movable. Referring to FIG. 16, a base (109), which mounts a stage 105 thereon, is movably supported on a board (110) through an air bearing. Rotatable rotors 108 are arranged on the side surfaces of the base and in it. With this structure, the drive reaction force of the stage in the X and Y directions is canceled when the base moves, and the drive reaction forces in a θ direction, an ωx direction (a rotational direction about an X axis), and an ωy direction (a rotational direction about a Y axis) are canceled when the rotors rotate.

In recent years, the diameter of the wafer increases to increase the productivity of the devices, and the size of the stage also increases in proportion to the diameter of the wafer. Accordingly, the weight of the stage also increases. In order to increase the throughput (the number of wafers that can be processed within a unit time), the stage must be moved faster, and tends to be moved with a high acceleration. Namely, as the stage weight and stage acceleration increase, the thrust of the stage increases to be larger than before.

As in Japanese Patent Laid-Open No. 11-190786, in a structure in which the reaction force is canceled by moving the base in the X and Y directions with respect to the board, a space must be reserved for the moving stroke of the base. For this purpose, the size of the entire stage device increases, and consequently, the exposure apparatus itself becomes bulky.

The stroke of the base may be decreased by increasing the weight of the base. When transportation and maintenance of the stage device are taken into consideration, the weight of the base cannot be increased much.

In the case of levitating the base by an air bearing, when the base having a weight of several tons is to be levitated by the air bearing, the air bearing must have an accordingly large load capacity. When the load capacity of the air bearing is increased, however, the flow rate of air to be supplied must also be increased. Such a stage device is sometimes difficult to install, depending on the specifications of the utilities of the installation site.

As in Japanese Patent Laid-Open No. 11-243132, if the mass bodies are provided to the side surfaces of the base, the installation space increases undesirably. As the masses hang, they may undesirably deform the base or degrade the posture of the base.

SUMMARY OF THE INVENTION

According to the present invention, a stage device comprises a movable stage, a base which supports the stage, and a mass body which moves to cancel a reaction force acting on the base as the stage moves, wherein the base has a plurality of surfaces, and the stage and mass body are supported by different ones of the surfaces of the base.

Thus, a stage device including a reaction force canceling mechanism can be provided, in which degradation of accuracy caused by deformation, or the like, is suppressed.

From the viewpoint of an installation space, preferably, the base has an inner space, and the mass body is arranged in the space.

Preferably, a damping member is arranged in the space to suppress vibration.

Preferably, the base has a rotary mass body, which rotates to cancel a reaction force in a rotational direction, which acts on the base as the stage moves.

The stage device may have a guide, which movably guides the mass body in at least two axial directions, and the mass body and guide may respectively comprise a plurality of mass bodies and a plurality of guides for each axis.

Preferably, the stage is moved by a planar motor with respect to the base.

The stage can comprise a plurality of stages, and the plurality of stages can be supported by a common base.

The stage device as described above is preferably used for alignment of a master or substrate in an exposure apparatus. Preferably, a wafer is exposed by such an exposure apparatus and developed to manufacture a device.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 is a view showing the entire structure of a stage apparatus which uses a reaction force canceling mechanism according to the second embodiment;

DETAILED DESCRIPTION OF THE PREFERRED EMBODIMENTS

Preferred embodiments of the present invention will now be described in detail in accordance with the accompanying drawings.

First Embodiment

Figure 1:
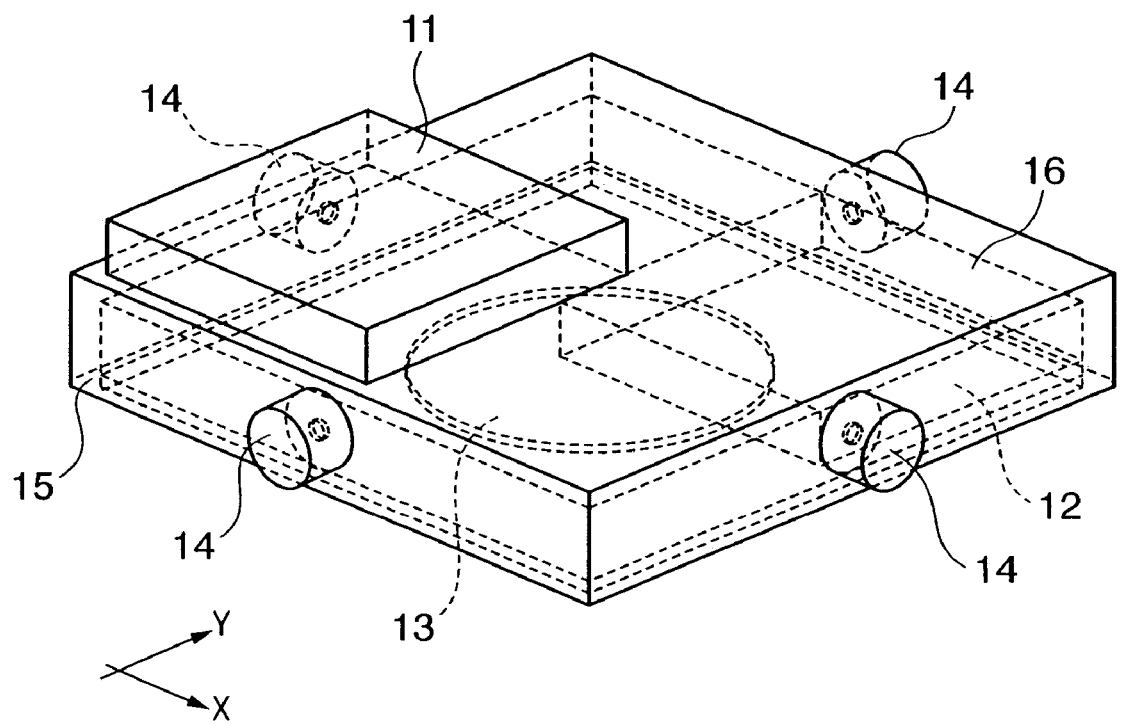
FIG. 1 is a view showing the entire structure of a stage device which uses a reaction force canceling mechanism according to the first embodiment.
Figure 2:
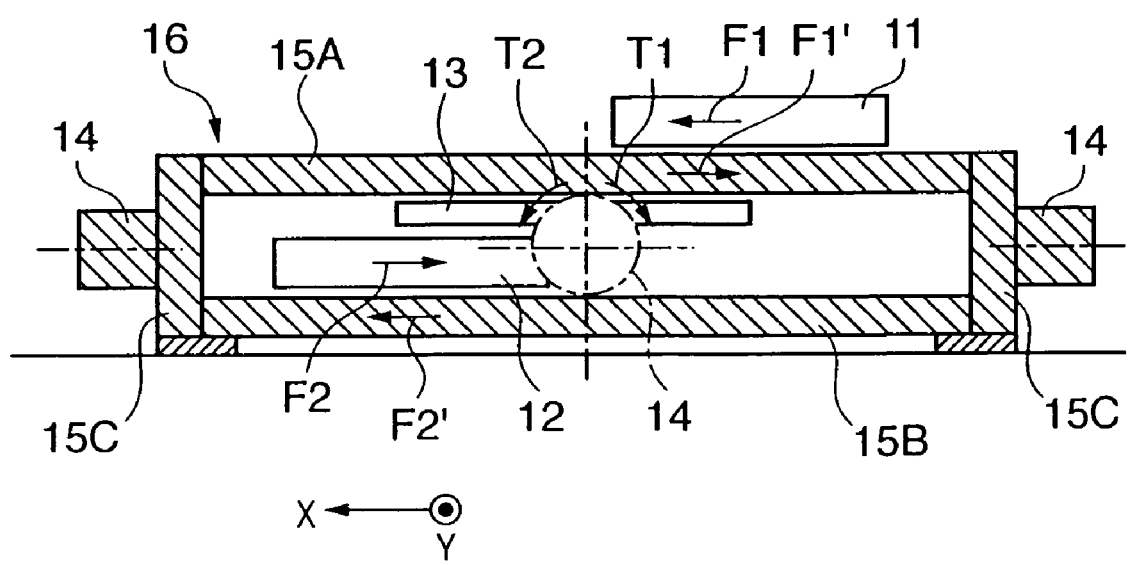
FIG. 2 is a view for explaining how to cancel reaction forces in X and Y directions and about X- and Y-axes.

FIG. 1 is a schematic view of a stage device according to the first embodiment. FIG. 2 is a sectional view of the base of FIG. 1. A stage 11 is supported above the upper surface of a base 15 not to be in contact with the base 15, through an air bearing (not shown). The base 15 has a hollow structure defined by a top plate 15A, a bottom plate 15B, and side plates 15C, arranged on its four surfaces. A mass 12 as a mass body is supported on the upper surface of the bottom plate 15B. The mass 12 can move in X and Y directions in the base 15.

The top plate 15A, bottom plate 15B, and side plates 15C are integrally connected to each other, and supported by a floor or air mount (anti-vibration base) (not shown). The base is not limited to one in which the respective plates are connected to each other, but can be one, which is integrally formed by casting, or the like. If the influence that floor vibration poses on the stage performance is non-negligible, an air mount is preferably used. If the influence is negligible, no air mount need be used. Then, the cost can be suppressed.

A rotor 14 serving as a rotary mass body is attached to the central portion of each side plate 15C. The rotor 14 has a fixed portion (not shown) fixed to the side plate 15C and a movable portion (not shown), which rotates with respect to the fixed portion. A rotor 13 is provided to that surface of the top plate 15A, which is opposite to the stage 11, and has a fixed portion and a movable portion in the same manner.

How to move the stage 11 and mass 12 will be described.

The stage 11 can be moved in the X and Y directions by a so called planar motor upon reception of a force from the top plate 15A to which a stator (not shown) is fixed. The stator may be formed integrally with the top plate 15A. The planar motor can be a variable magnetoresistive motor (to be referred to as a planar pulse motor hereinafter) or a Lorentz motor.

When the motor is a variable magnetoresistive motor, it has a tooth as the stator. This motor is disclosed in Japanese Patent Laid-Open No. 11-190786 and 2002-023764. When the motor is a Lorentz motor, it has a magnet or coil as the stator. This motor is disclosed in Japanese Patent Laid-Open No. 2004-254489. A detailed description of these driving mechanisms will be omitted. The stage 11 may move not only in the X and Y directions, but also in X, Y, Z, θ (a rotational direction about a Z-axis), ωx (a rotational direction about an X-axis), and ωy (a rotational direction about a Y-axis) directions.

In the same manner as the stage 11, the mass 12 can be moved by a planar motor in the X and Y directions with respect to the bottom plate 15B serving as a stator, and can employ either the variable magnetoresistive scheme or Lorentz scheme described above. A case wherein the mass is driven not by a planar motor, but by a motor having a guide, is shown in the second embodiment.

How to cancel the reaction of the stage will be described with reference to FIG. 2.

When a thrust F1 is applied to the stage 11 in a +X direction to accelerate it, a drive reaction force F1' of the stage acts on the top plate 15A in a −X direction. When the stage 11 is driven, a thrust F2 is simultaneously supplied to the mass 12 in the −X direction to accelerate it. Then, a drive reaction force F2' of the mass 12 acts on the bottom plate 15B. When the two drive reaction forces F1' and F2' are adjusted to be equal to each other, the drive reaction force acting on the base 15 is canceled, and consequently, the force acting on the base 15 can be set to almost zero.

How to cancel the moment reaction force of the stage will be described with reference to FIG. 2. In FIG. 2, a rotor 14 is indicated by a broken line.

When the stage 11 accelerates in the +X direction, the drive reaction force F1' of the stage acts on the top plate 15A. As the action point of the drive reaction force F1' of the stage does not coincide with the barycenter of the base 15, a moment T1 acts clockwise on the base 15.

When the mass 12 accelerates in the X direction, the drive reaction force F2' of the mass 12 acts on the bottom plate 15B, and a moment T2 acts on the base 15. The rotors 14 provided to the side plates 15C are rotated to exert counter moments on the base 15, thus canceling the moments that act on the base by the movements of the stage and the mass. As a result, the moments about the X- and Y-axes that act on the base 15 can be set to be almost zero.

How to cancel the moment about the Z axis by using a rotor similar to the rotor 13 will be described with reference to FIG. 3.

Figure 3:
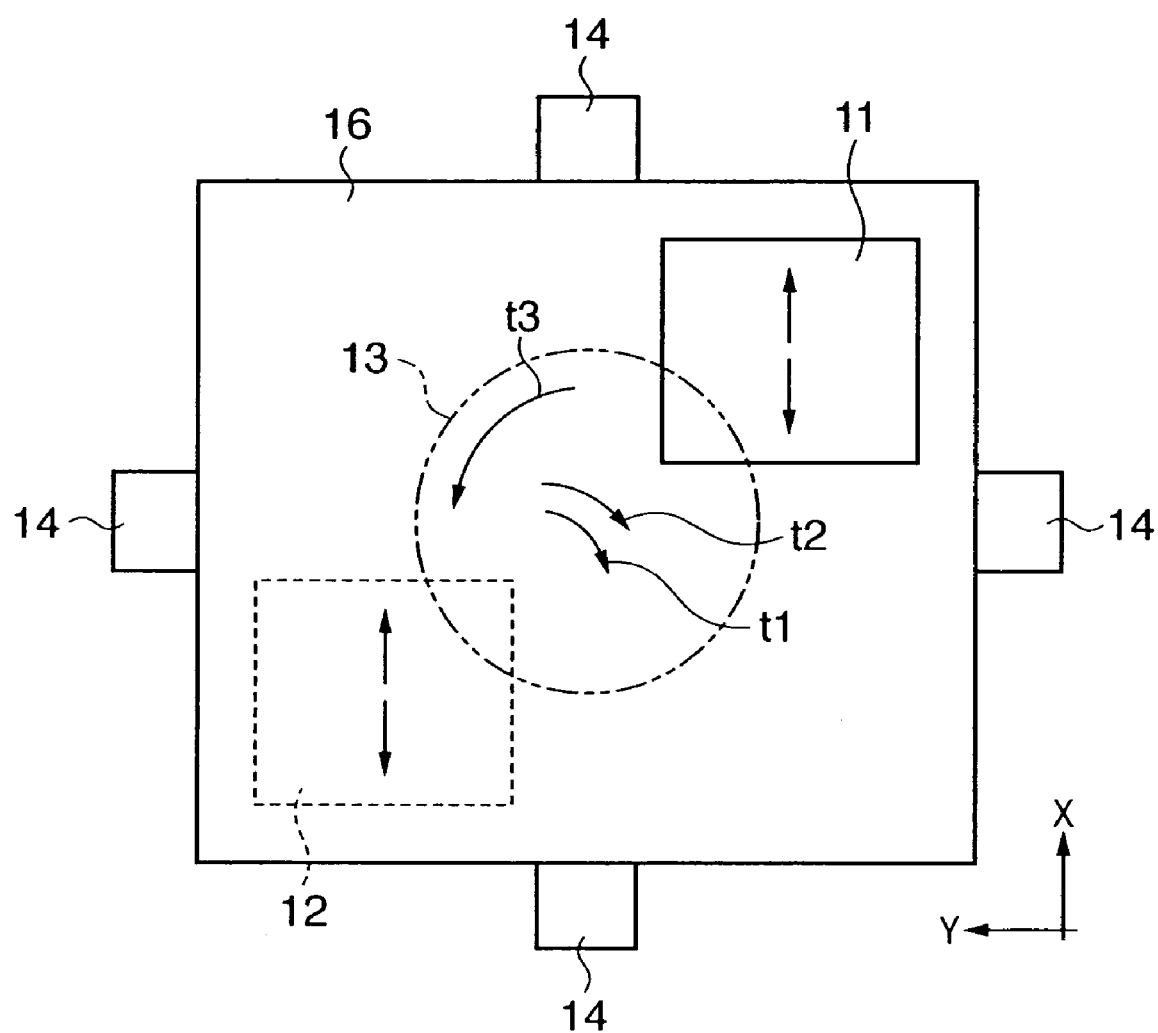
FIG. 3 is a view for explaining how to cancel a moment about a Z-axis.

FIG. 3 is a view of the stage device as seen from above. When the stage 11 accelerates in the +X direction, the drive reaction force F1" of the stage 11 acts on the top plate 15A in the −X direction. Thus, a moment t1 acts on the base 15 clockwise. When the mass 12 accelerates in the −X direction, a moment t2 acts on the base 15 clockwise, due to the drive reaction force F2' of the mass 12. In order to cancel the moments t1 and t2, the rotor 13 provided to the lower surface of the top plate 15A is rotated clockwise. Then, a reaction moment t3 acts on the base 15 counterclockwise. When the counter moment t3 is adjusted to be equal to the sum of t1 and t2, the moment about the Z-axis that acts on the base 15 can be set to be almost zero.

The clockwise/counterclockwise direction in the above description is determined in accordance with at which position the stage 11 and mass 12 are located with respect to the barycenter of the base 15.

The stage 11 and mass 12 are positioned such that the barycenter of an entire stage unit 16 shown in FIG. 1 is located at the center of the base 15. Then, even when the stage 11 and mass 12 move, the moments generated by the moving loads can be set to zero. In this case, no system is additionally required to compensate for the influence by the moving load of the stage.

In the above embodiment, the base 15 has a guide surface (the upper surface of the top plate 15A) for supporting the stage 11 and a guide surface (the upper surface of the bottom plate 15B) for guiding the mass 12. The mass 12 moves to cancel the reaction force in a translational direction, which acts on the base 15 as the stage 11 moves. Thus, the stage 11 can be less influenced by a disturbance, such as deformation of the base which accompanies the movement of the mass.

The base 15 has a hollow structure and the mass 12 is provided in the base 15. Thus, in addition to the effect described above, the base need not be moved with a large stroke to cancel the reaction force, and a mass need not be externally attached to the base. Thus, an increase in the installation space can be prevented.

In addition to the presence of the mass described above, the rotors are provided, which move to cancel the reaction forces in the rotational direction that act on the base 15 as the stage 11 moves. Thus, in addition to the translational direction, the reaction forces in the rotational direction can also be canceled. Consequently, a mechanism which cancels the reaction forces in the respective axial directions can be provided, while suppressing the installation space.

In the base 15, the top plate 15A, which guides the stage and the bottom plate 15B, which guides the mass, are connected to each other through the side plates 15C. The influence caused when the stage and mass move is dispersed in the respective plate-like members to prevent a local deformation, and the like.

When the guide surfaces for the stage and mass serve as support surfaces that respectively support the stage and mass, the effect of decreasing the deformation and the influence of the disturbance becomes more conspicuous.

The stage can be moved by the planar motor with respect to the base. The entire stage device can thus have a simple structure with a small installation space. Also, the influence of the deformation of the guide, or the like, is small. As a result, high accuracy can be realized.

<Modification>

FIGS. 4 to 7 show modifications. In the following modifications, the support positions of the stage 11, mass 12, and rotor 13 are changed. Those respects which are not particularly mentioned are the same as those in the first embodiment.

Figure 4:
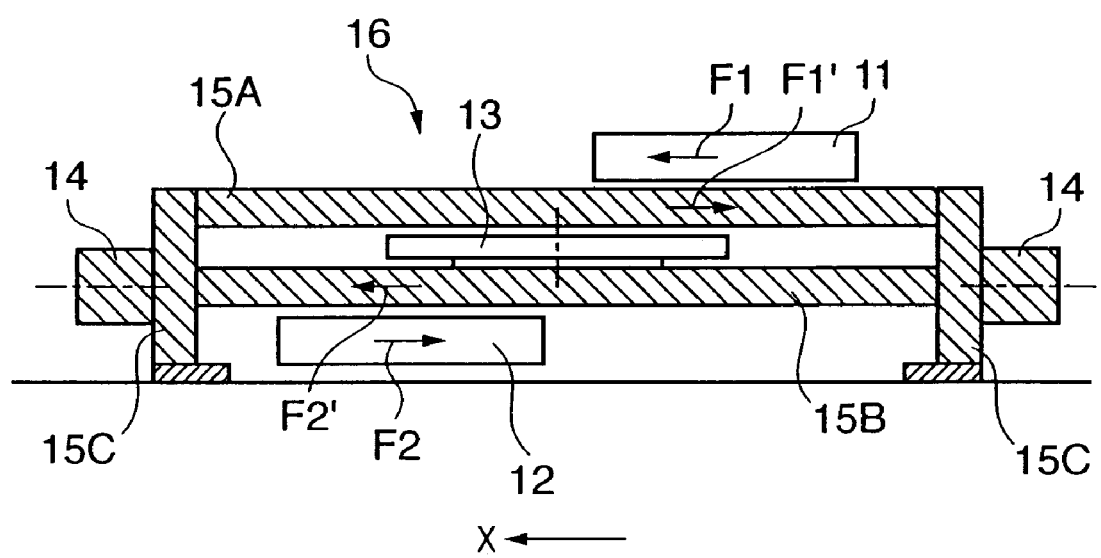
FIG. 4 is a view showing a structure in which a mass and rotor are provided to the lower and upper surfaces, respectively, of a bottom plate, as a modification of the first embodiment.

In the first embodiment (FIG. 2), the rotor 13 is arranged on the lower surface of the top plate 15A. In FIG. 4, the rotor 13 is provided to the bottom plate 15B. In this manner, when the rotor 13, which cancels the reaction force in the rotational direction about the Z axis is supported by a member different from the top plate 15A, which guides the stage 11, the stage 11 can be prevented from being influenced by the deformation caused by the weight of the rotor 13.

When the mass 12 is arranged on the lower surface of the bottom plate 15B, the weight of the mass 12 can be supported by the base surface, so that a local deformation can be prevented.

As the mass 12 has a function of canceling the reaction force, it must receive a driving force from the bottom plate 15B side. Regarding the driving force, it may be supplied from a linear motor having a guide, or a so-called planar motor having no guide.

Figure 5:
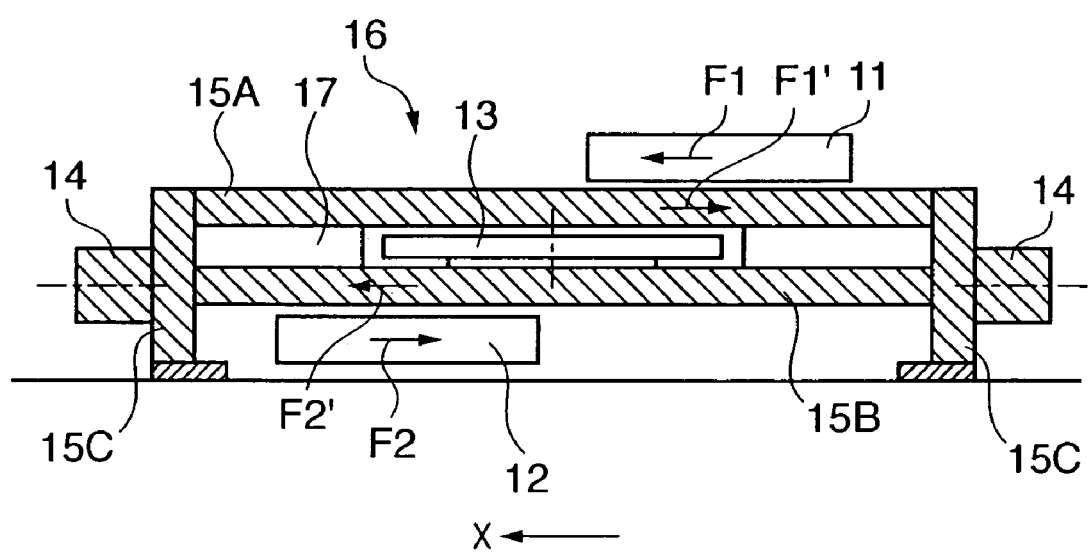
FIG. 5 is a view showing a structure in which an attenuation member is arranged between a top plate and the bottom plate.

In FIG. 5, a stage, mass, and rotor are supported in the same manner as in FIG. 4. A damping member is interposed (in an inner hollow portion) between the top plate 15A and bottom plate 15B. Thus, the effect of a damping vibration generated in the respective plate-like members and the effect of decreasing transmission of the vibration between the plate-like members can be expected.

Figure 6:
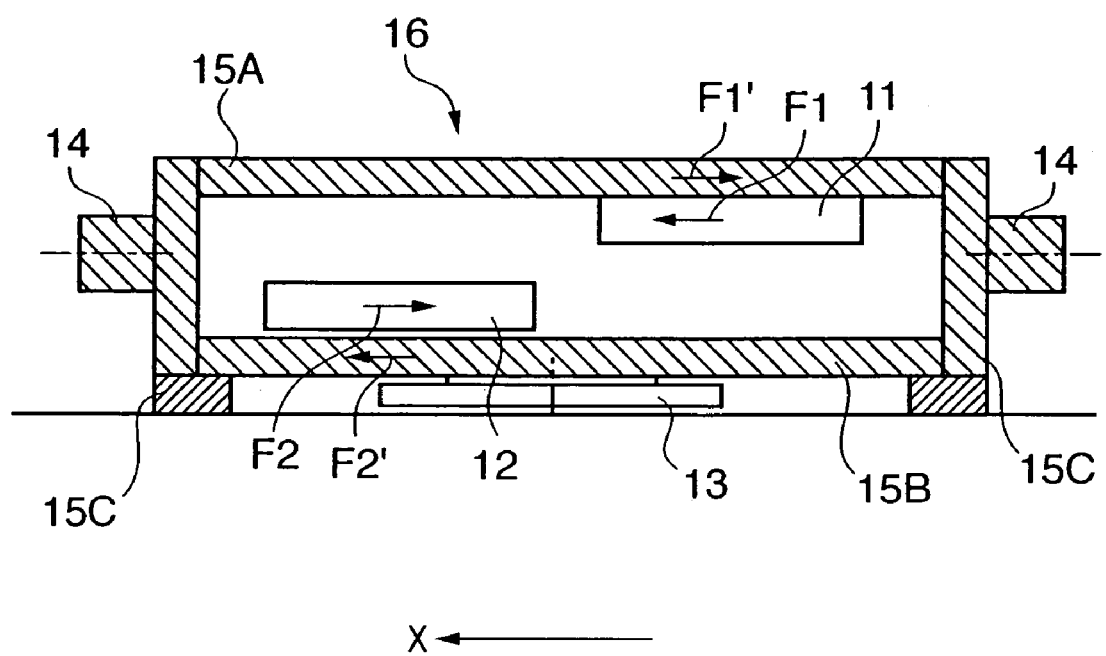
FIG. 6 is a view showing a structure in which a stage and mass are arranged in a base.

FIG. 6 shows a case wherein the stage 11 is arranged on the lower surface of the top plate 15A, the mass 12 is arranged on the upper surface of the bottom plate 15B, and a rotor is arranged on the lower surface of the bottom plate 15B.

Figure 7:
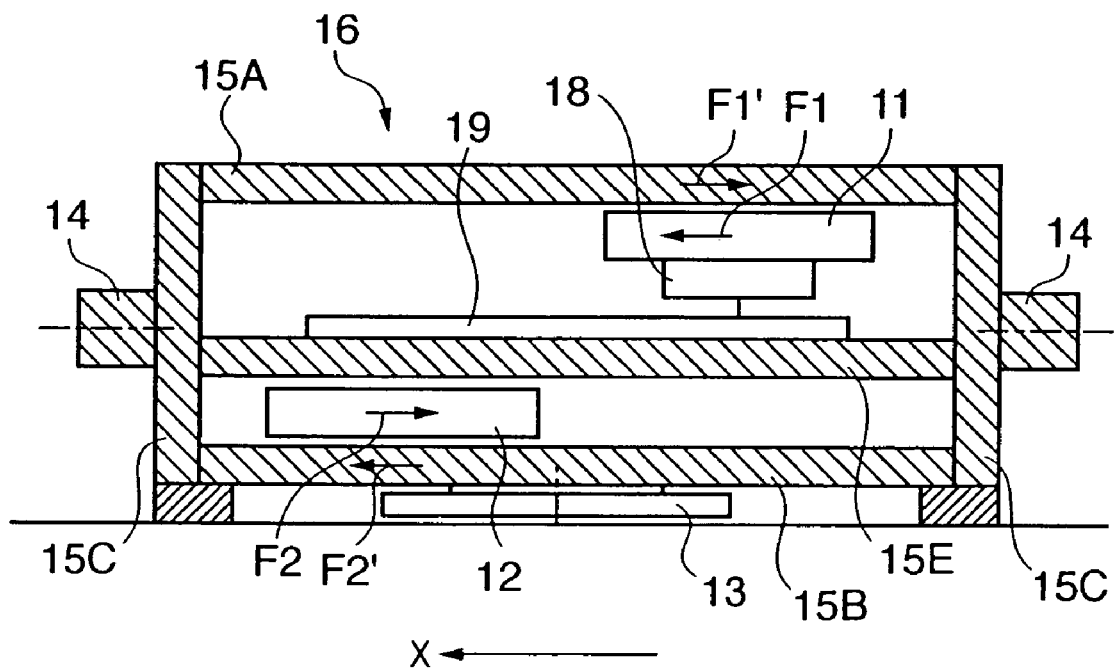
FIG. 7 is a view showing a structure in which a stage and mass are arranged in a base and a middle plate is arranged between the stage and mass.

FIG. 7 shows a case wherein a middle plate 15E is arranged between the top plate 15A and bottom plate 15B. A measuring means (or working means) 18 is provided to the stage 11, and a measuring target (or working target) 19 is fixed to the middle plate 15E. The stage, measuring target, and mass, which move in the base 15, can be integrally supported by the base 15, so that the stage device can be made compact. An example of the measuring means includes electrical measurement, mechanical size measurement, and the like. An example of the measuring target includes an electrical board and a mechanical component. An example of the working means includes a laser working tool. An example of the working target includes a metal material, and the like.

Second Embodiment

Figure 9:
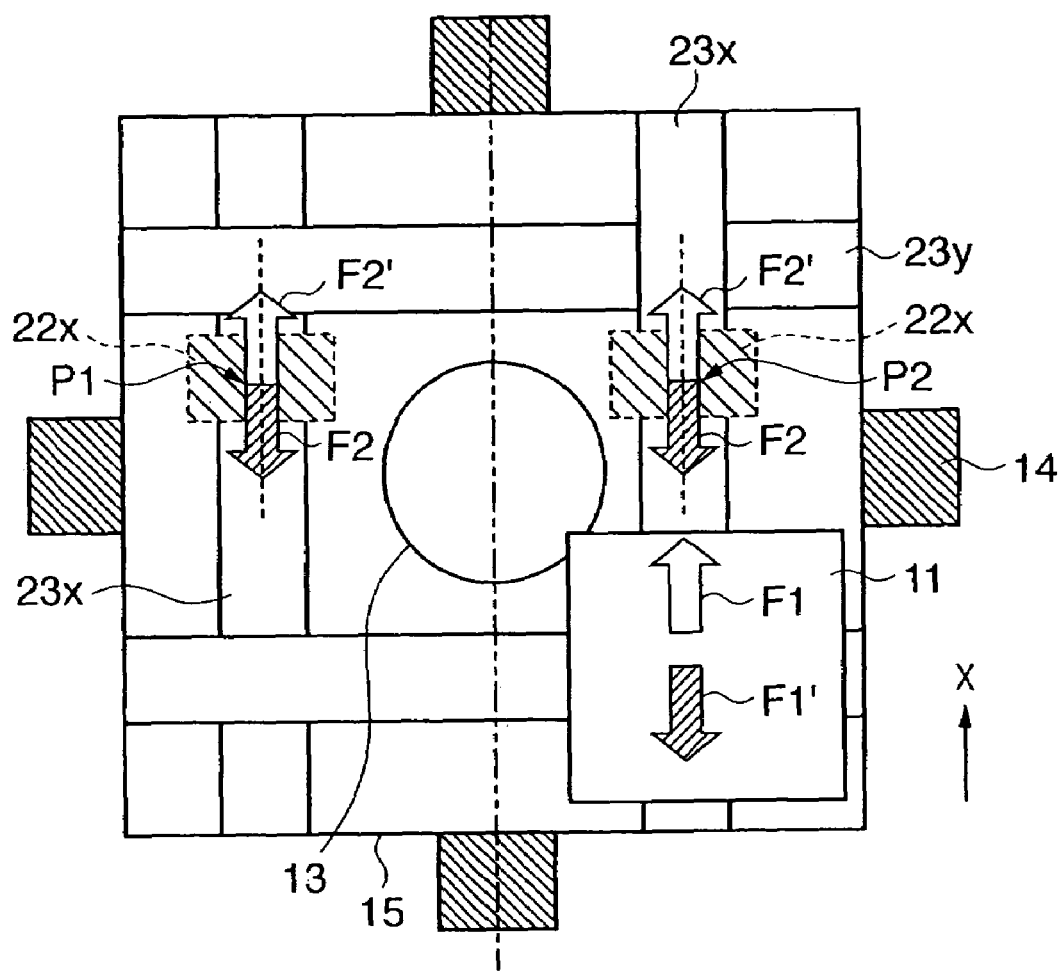
FIG. 9 is a view for explaining how to cancel reaction forces in X and Y directions and about a Z-axis, in the second embodiment.
Figure 10:
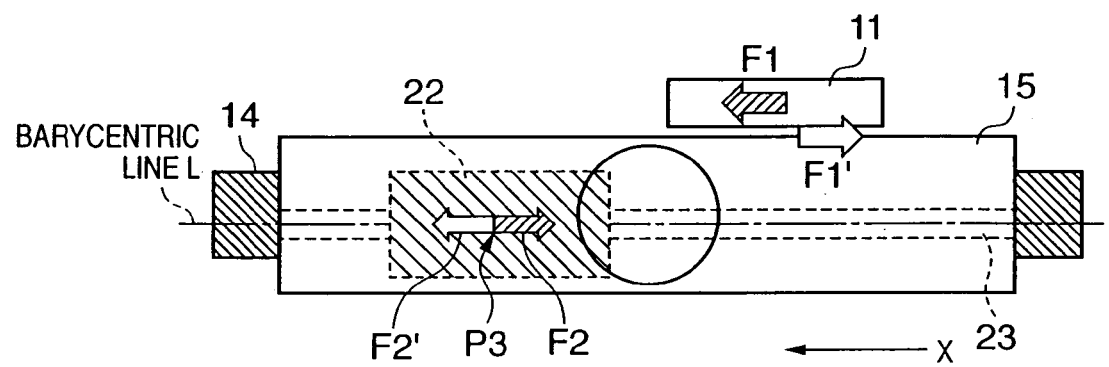
FIG. 10 is a view for explaining how to cancel reaction forces about the X- and Y-axes in the second embodiment.

FIGS. 8 to 10 are schematic views of the second embodiment.

The second embodiment is obtained by providing guides to the mass in the first embodiment. An explanation of the identical portions as in the first embodiment will be omitted, as it is identical to the explanation for the first embodiment.

FIG. 8 is an entire schematic view of a stage device according to the second embodiment. The interior of a base 15, which is indicated by a broken line in FIG. 8, is the characteristic portion. FIG. 9 is a view showing the interior of the base.

In the base 15, masses 22 are movably guided by guides 23 which form parallel crosses. The guides 23 are fixed to the base 15 and have linear motor stators. Therefore, the guides can supply forces to the masses 22 serving as linear motor movable elements. The reaction forces of the supplied forces are transmitted to the base 15 through the guides 23.

One mass 22 is provided to each of the two guides, which are parallel to the X direction. Although not shown, a mass 22 is provided to each of the two guides, which are parallel to the Y direction.

How to cancel the reaction force in the second embodiment will be described with reference to FIG. 9. When a stage 11 accelerates in a +X direction, its drive reaction force F1' acts on the base 15 in a −X direction. In order to cancel this drive reaction force, the two masses 22 arranged in the base 15 are accelerated in the −X direction at an acceleration half the thrust of the stage 11. Then, the drive reaction force F1' of the stage becomes equal to a force twice a drive reaction force F2' of the masses, and the reaction force generated by stage driving is canceled completely. The reaction force in the Y direction is also canceled in the same manner as the reaction force in the X direction.

How to cancel the moment that acts about a Z-axis in the second embodiment is based on the same idea as that in the first embodiment. Note that in the second embodiment, power points P1 and P2 of the masses 22 are symmetric with respect to a barycentric line L of the base 15. Even when the masses 22 move, no moment is generated about the Z-axis. Therefore, a rotor 13 may be rotated such that the drive reaction force F1' becomes equal to the moment about the Z-axis, which is generated in the base 15 when the stage 11 accelerates.

How to cancel the moment that acts about the x-axis and y-axis will be described with reference to FIG. 10. FIG. 10 is a side view of the second embodiment. If power points P3 of reaction forces, which act on the linear motor stators while the masses 22 are driven are located on the barycentric line L of the base 15, the moments exerted when the masses 22 are driven become 0 (zero). Hence, the moments necessary to rotate rotors can be equal to the moments generated by the reaction force F1', which acts on the base 15 when the stage 11 is driven. If the power points P3 of the reaction forces of the masses 22 are not located on the barycentric line L, when the masses 22 are driven, moments act on the base 15. In this case, a moment obtained by multiplying a difference in height between the barycentric line L and the power points P3 of the reaction forces of the linear motors by the reaction forces of the linear motors must be applied to the rotors.

In this embodiment, the linear motors are arranged to form parallel crosses. Alternatively, the linear motors may be arranged to form a cross, or an H-letter shape. When the linear motors are arranged to form parallel crosses, a space for setting the rotor 13 can be reserved to downsize the entire stage device.

Third Embodiment

Figure 11:
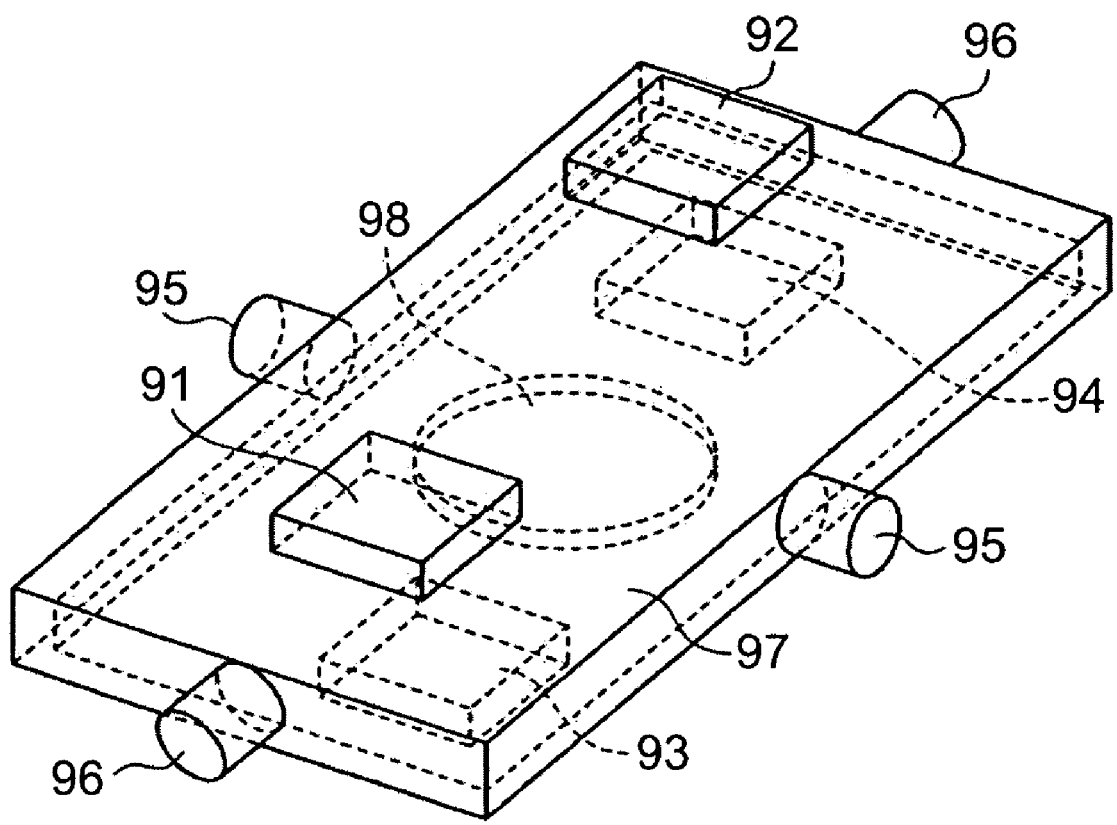
FIG. 11 is a view showing a stage device having two stages.

FIG. 11 is a schematic view of a stage device according to the third embodiment. A detailed explanation at those portions in the third embodiment, which have the same functions as those in the first and second embodiments, will be omitted, as it is identical to the explanation for the first and second embodiments. In the first and second embodiments, one stage is provided. In the third embodiment, a plurality of stages are provided. More specifically, stages 91 and 92 are arranged on a base 97, and masses 93 and 94 are arranged on the lower surface of the base 97. The stages 91 and 92 and masses 93 and 94 are arranged such that the barycenter of an entire sage unit shown in FIG. 11 coincides with the barycenter of the base 97. Rotors 95 and 96 are arranged on the side surfaces of the base 97, and a rotor 98 is arranged on the lower surface of the top plate of the base 97.

How to cancel the reaction force and moment, which act on the base 97 when the stage is driven, is the same as that in the first embodiment. Note that the drive reaction force, which acts on the base when the stage 91 accelerates or decelerates, is canceled by the mass 93, and the drive reaction force which acts on the base 97 when the stage 92 accelerates or decelerates is canceled by the mass 94.

The moments about the X-, Y-, and Z-axes, which are generated in the base 97 when the stages 91 and 92 and masses 93 and 94 accelerate or decelerate, can be canceled in the same manner as that in the first and second embodiments. Note that as the two stages and two masses are provided, the moments acting on the base 97 upon acceleration and deceleration of the respective stages and masses must be calculated, and moments must be exerted on the rotors 95 and 96 to cancel the sum moment.

(Example Applied to an Exposure Apparatus)

Figure 12:
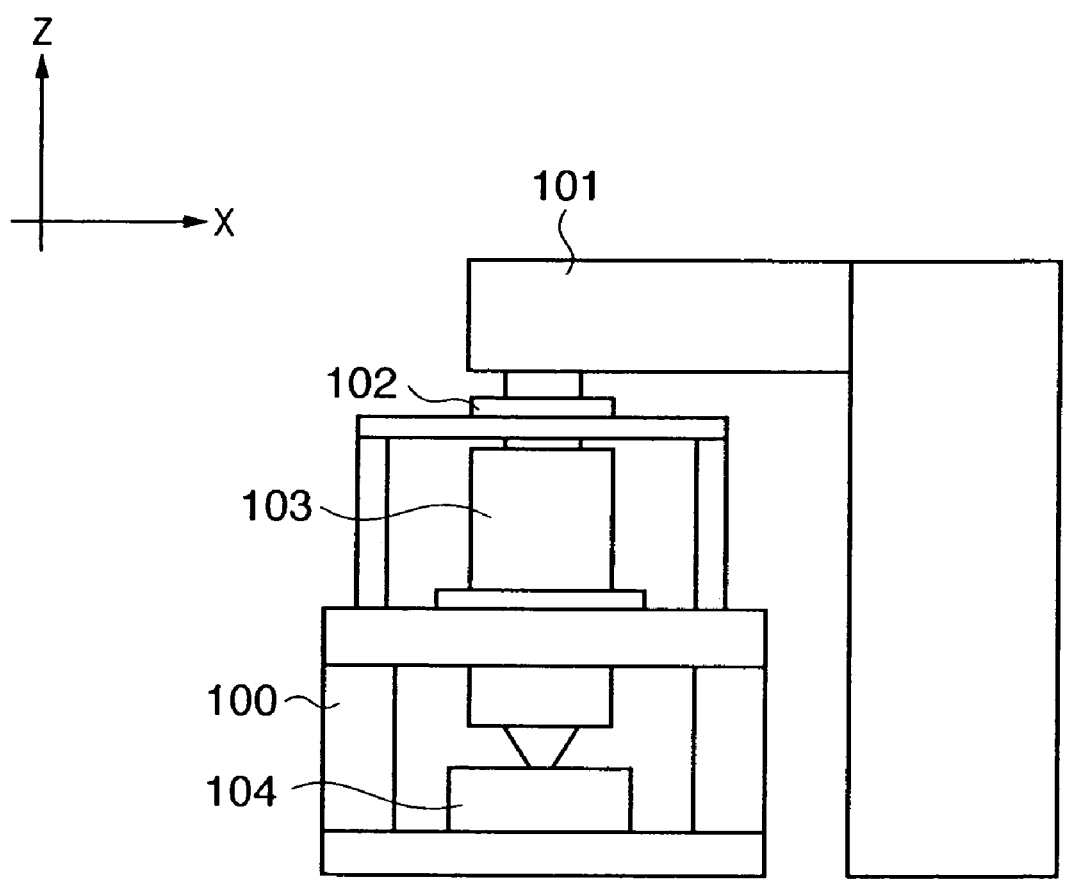
FIG. 12 is a view showing an exposure apparatus.

FIG. 12 is a view showing a case in which the stage device described above is applied to a semiconductor device manufacturing exposure apparatus. The structure of the exposure apparatus is merely an example, and can be appropriately changed when necessary, without departing from the spirit and scope of the present invention.

This exposure apparatus is used to manufacture devices having fine patterns, e.g., a semiconductor device, such as a semiconductor integrated circuit, a micromachine, and a thin film magnetic head. Exposure light (this is a generic term for visible light, ultraviolet light, EUV light, X-rays, an electron beam, a charged particle beam, or the like) serving as exposure energy from an illumination system unit 101 through a reticle, as an original, irradiates a semiconductor wafer W, as a substrate, through a projection lens 103 (this is a generic term for a dioptric lens, a reflecting lens, a cata-dioptric lens system, a charged particle lens, or the like) serving as a projecting system to form a desired pattern on a substrate mounted on a wafer stage 104.

A wafer, as the substrate, is held on a chuck mounted on the wafer stage 104. The pattern of the reticle as the original mounted on a reticle 102 is transferred onto the respective regions on the wafer by the illumination system unit 101 in accordance with step and repeat or step and scan.

An alignment scope (not shown) is provided to align the shots in the wafer, or the wafer and the reticle. When the exposure apparatus performs an alignment process and an exposure process simultaneously, it can have two stages, as in the third embodiment.

When the stage devices according to the first to third embodiments are used as the wafer stage or reticle stage described above, or as both of them, the accuracy of the exposure apparatus can be improved without increasing the installation area.

(Device Manufacturing Method)

Figure 13:
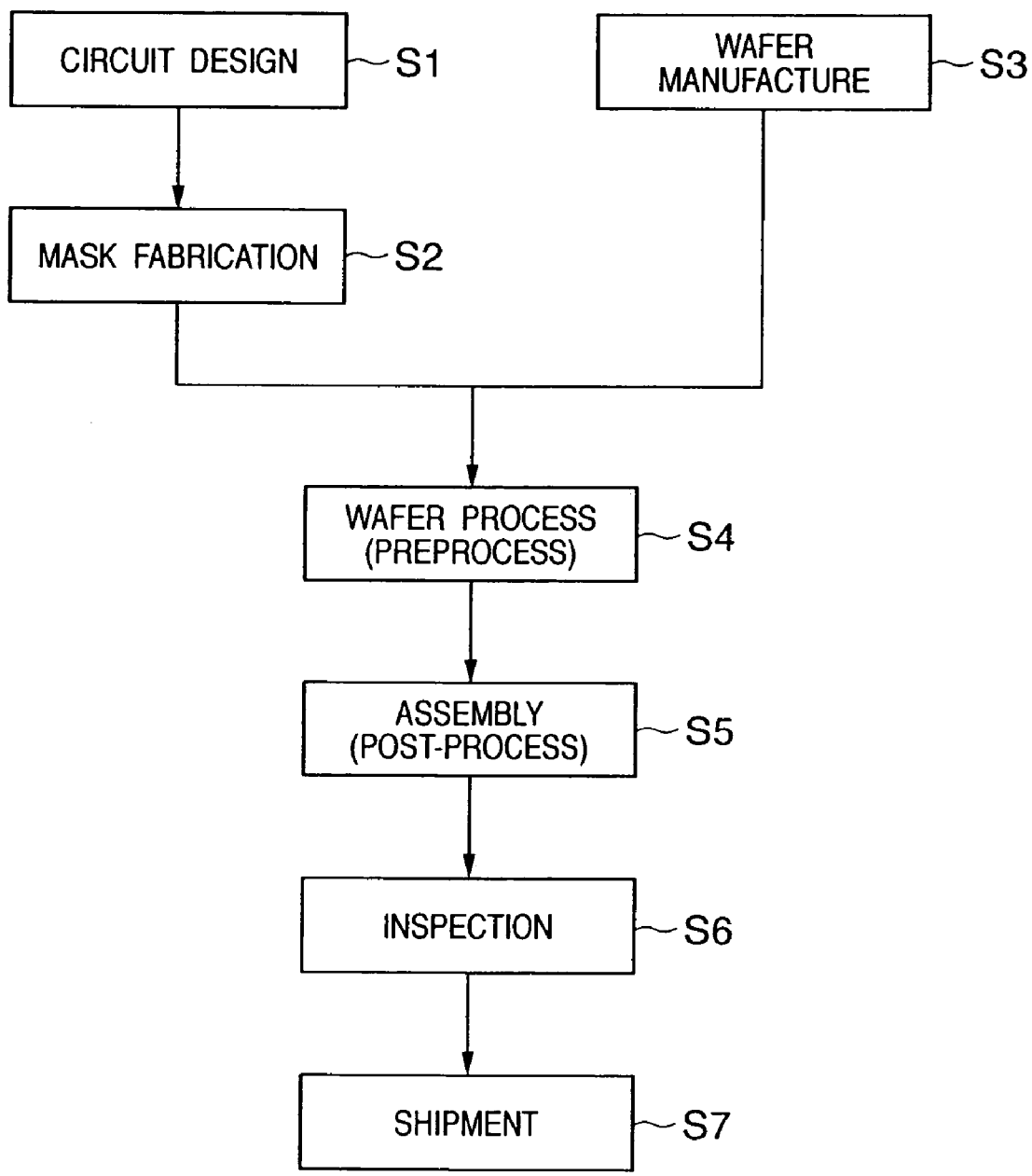
FIG. 13 is a flowchart for explaining a semiconductor manufacturing process.

A semiconductor device manufacturing process which uses this exposure apparatus will be described. This device manufacturing process is merely an example and can be appropriately changed when necessary without departing from the spirit and scope of the present invention. FIG. 13 is a flowchart showing the flow of an entire semiconductor device manufacturing process. In step 1 (circuit design), the circuit of a semiconductor device is designed. In step 2 (mask fabrication), a mask is fabricated on the basis of the designed circuit pattern.

In step 3 (wafer manufacture), a wafer is manufactured using a material such as silicon. In step 4 (wafer process), called a preprocess, an actual circuit is formed on the wafer by the exposure apparatus described above, in accordance with lithography, using the mask and wafer described above. In step 5 (assembly), called a post process, a semiconductor chip is formed from the wafer fabricated in step 4. This step includes processes such as assembly (dicing and bonding) and packaging (chip encapsulation). In step 6 (inspection), inspections, such as an operation check test and a durability test of the semiconductor device fabricated in step 5 are performed. A semiconductor device is finished with these steps and shipped in step 7.

Figure 14:
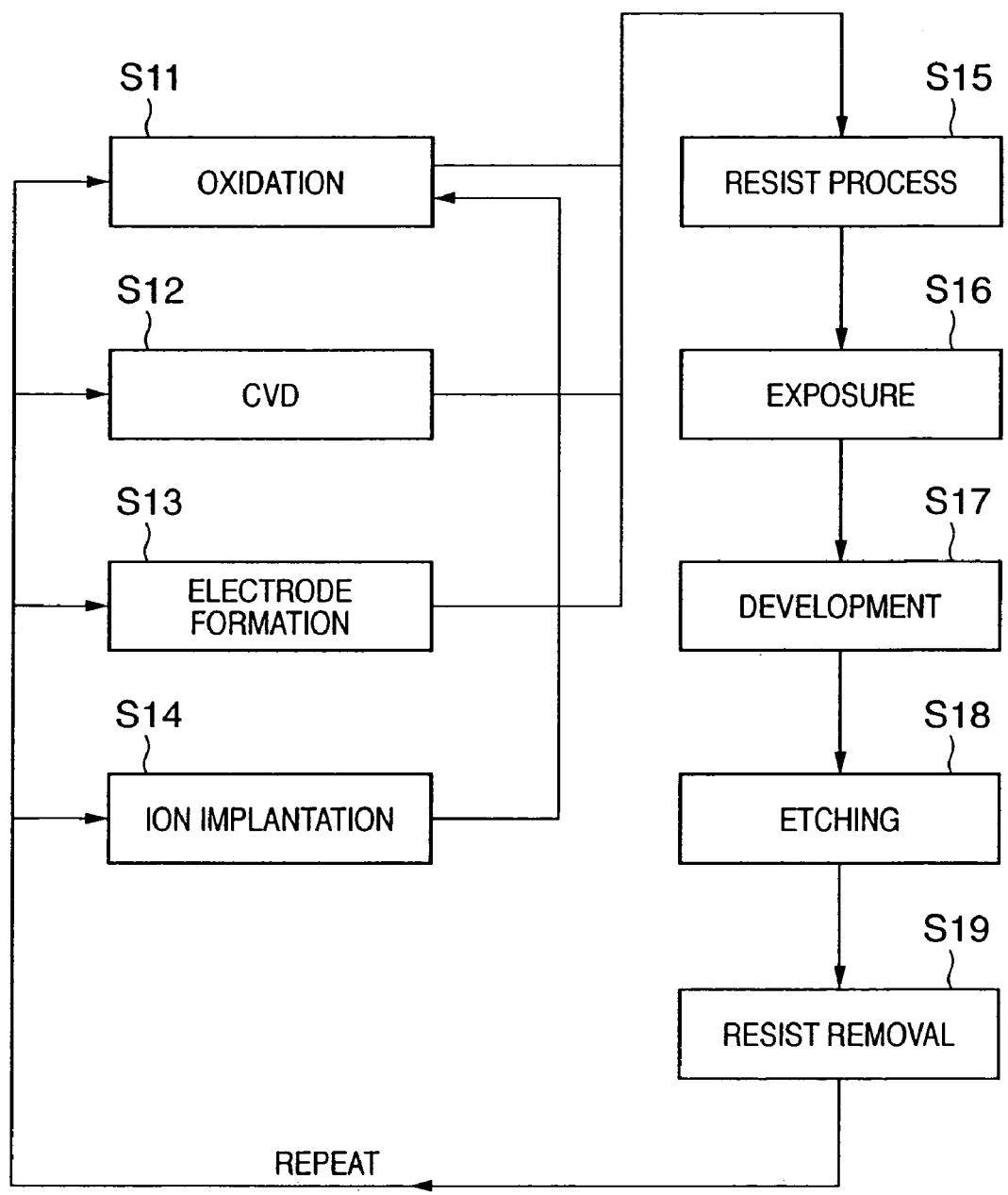
FIG. 14 is a flowchart for explaining a wafer process.
Figure 15:
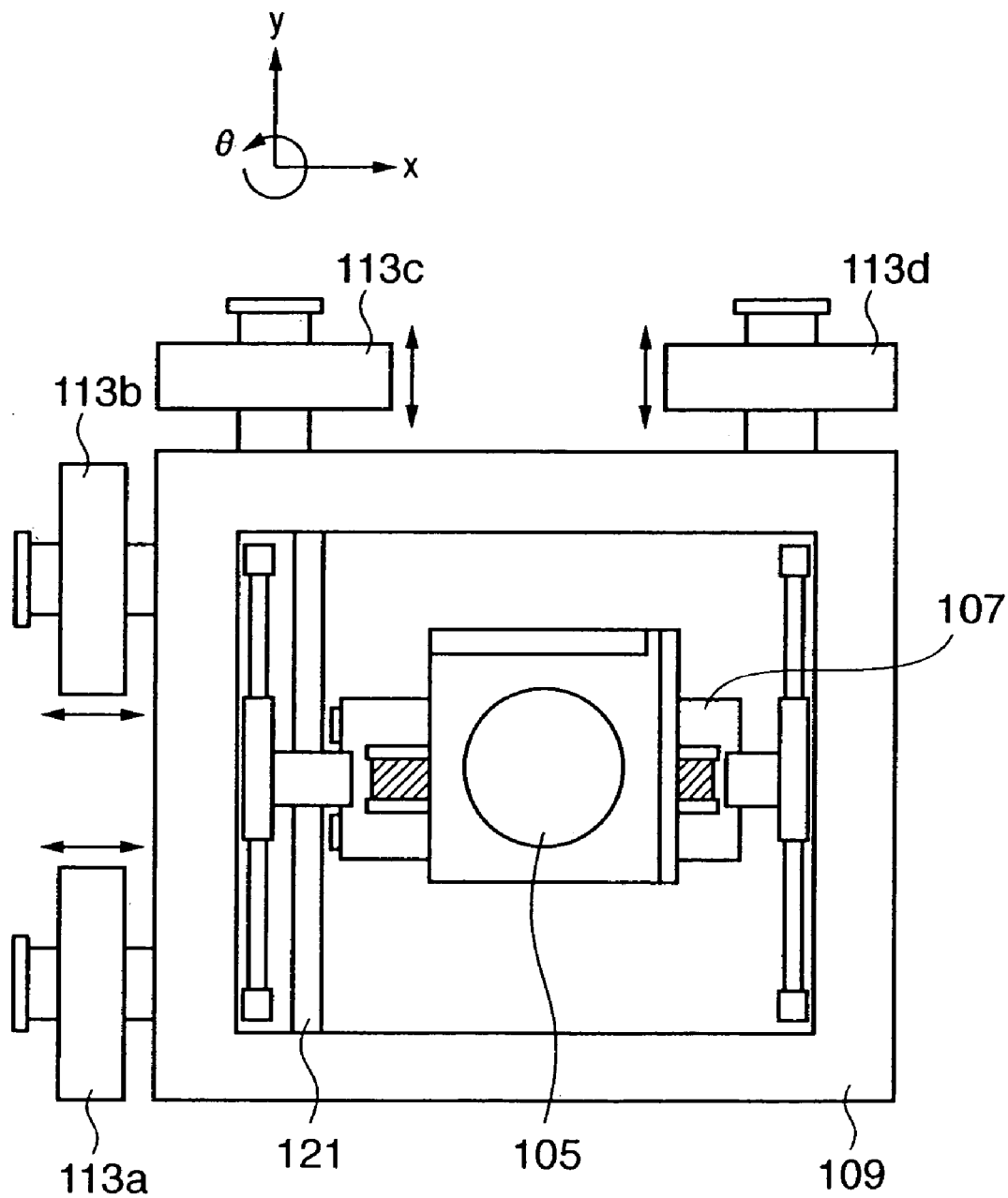
FIG. 15 is a view for explaining a conventional example.
Figure 16:
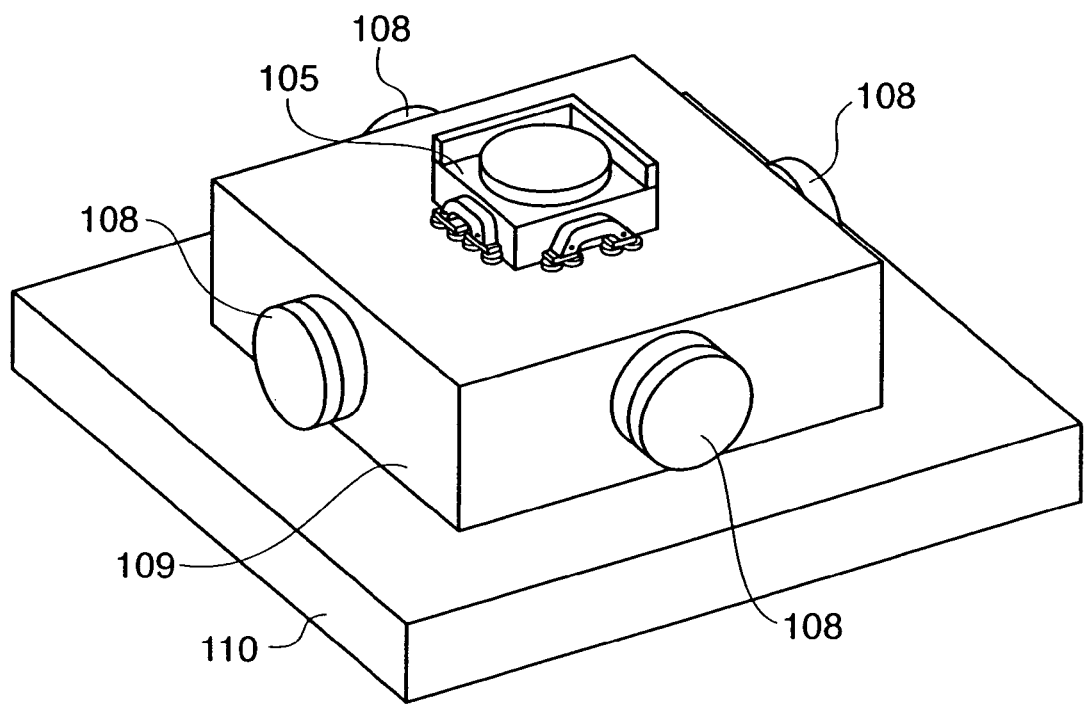
FIG. 16 is a view for explaining a conventional example.

The wafer process of step 4 has the following steps (FIG. 14), i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of removing portions other than the resist image developed in the developing step, and a resist removal step of removing any unnecessary resist after etching. These steps are repeated to form multiple circuit patterns on the wafer.

While the present invention has been described with respect to what is at present considered to be the preferred embodiments, it is to be understood that the invention is not limited to the disclosed embodiments. The present invention is intended to cover various modifications and equivalent arrangements included within the spirit and scope of the appended claims.

CLAIM OF PRIORITY

This application claims priority from Japanese Patent Application No. 2004-144896 filed on May 14, 2004, which is hereby incorporated by reference herein.

What is claimed is:

1. A stage device comprising:
   a movable stage;
   a plate-like base which supports said stage; and
   a mass body which moves to cancel a reaction force acting on said base according to a movement of said movable stage,
   wherein said plate-like base has a plurality of surfaces, and said stage and mass body are supported by different ones of said surfaces of said plate-like base.

2. The device according to claim 1, wherein said plate-like base has an inner space, and said mass body is arranged in the space.

3. The device according to claim 2, wherein a damping member is arranged in the space.

4. The device according to claim 1, further comprising a linear motor for moving said movable stage and said mass body,
   wherein said linear motor comprises a stator and a movable member, and
   wherein the stator is fixed to said plate-like base.

5. The device according to claim 1, wherein said plate-like base has a rotary mass body which rotates to cancel a reaction force in a rotational direction which acts on said plate-like base as said stage moves.

6. The device according to claim 1, wherein said movable stage can move in first and second directions along the surface of said plate-like base,
   wherein said mass body comprises a plurality of first mass bodies capable of moving in the first direction and a plurality of second mass bodies capable of moving in the second direction.

7. The device according to claim 1, further comprising a planar motor having a movable member provided on said stage and a stator provided along the surface of said plate-like base which supports said stage.

8. The device according to claim 1 wherein said stage comprises a plurality of stages, and said plurality of stages are supported by said common base.

9. An exposure apparatus for exposing a pattern of an original onto a substrate, which aligns the original or substrate by using a stage device according to claim 1.

10. A device manufacturing method comprising:
    a step of exposing a wafer by using an exposure apparatus according to claim 9; and
    a step of developing the wafer.

11. A stage device comprising:
    a movable stage;
    a plate-like base having a surface along which said stage is guided; and
    a mass body which moves to cancel a reaction force acting on said base according to a movement of said movable stage,
    wherein said base has an inner space, and said mass body is arranged in the space.

12. The device according to claim 11, further comprising a linear motor for moving said movable stage and said mass body,
    wherein said linear motor comprises a stator and a movable member, and
    wherein the stator is fixed to said plate-like base.

13. The device according to claim 11, wherein said movable stage can move in a first direction and a second direction along the surface of said plate-like base,
    wherein said mass body comprises a plurality of first mass bodies capable of moving in the first direction and a plurality of second mass bodies capable of moving in the second direction.

14. The device according to claim 11, further comprising a planar motor having a movable member provided on said stage and a stator provided along the surface of said plate-like base which supports said stage.

15. The device according to claim 11, wherein said stage comprises a plurality of stages, and said plurality of stages are guided along the surface of said plate-like base.

* * * * *